US 6,669,824 B2

(12) United States Patent
Sferlazzo et al.

(10) Patent No.: US 6,669,824 B2
(45) Date of Patent: *Dec. 30, 2003

(54) DUAL-SCAN THIN FILM PROCESSING SYSTEM

(75) Inventors: Piero Sferlazzo, Marblehead, MA (US); Chunghsin Lee, Lynnfield, MA (US)

(73) Assignee: Unaxis USA, Inc., St. Petersburg, FL (US)

( * ) Notice: Subject to any disclaimer, the term of this patent is extended or adjusted under 35 U.S.C. 154(b) by 216 days.

This patent is subject to a terminal disclaimer.

(21) Appl. No.: 09/840,394

(22) Filed: Apr. 23, 2001

(65) Prior Publication Data

US 2002/0005347 A1 Jan. 17, 2002

Related U.S. Application Data

(60) Provisional application No. 60/217,049, filed on Jul. 10, 2000, and provisional application No. 60/266,114, filed on Feb. 2, 2001.

(51) Int. Cl.[7] .................... C23C 14/34; C23C 14/35; C23C 16/00
(52) U.S. Cl. ............... 204/192.11; 204/298.04; 204/298.11; 204/298.16; 204/298.27; 204/298.28; 118/723 FI; 118/730; 427/248.1
(58) Field of Search .................. 204/192.1, 192.11, 204/192.13, 298.04, 298.03, 298.11, 298.27, 298.28, 298.29; 118/712, 723 R, 722 VE, 723 FI, 729, 730; 427/8, 248.1

(56) References Cited

U.S. PATENT DOCUMENTS

| | | | |
|---|---|---|---|
| 3,576,729 A | 4/1971 | Sigournay et al. | 204/192 |
| 3,635,811 A | 1/1972 | Lane | 204/192 |
| 3,829,373 A | 8/1974 | Keuhnle | 204/298 |
| 4,128,466 A | 12/1978 | Harding et al. | 204/192 C |
| 4,142,958 A | 3/1979 | Wei et al. | 204/192 R |
| 4,151,059 A | 4/1979 | Kuehnle | 204/192 R |
| 4,197,814 A | 4/1980 | Takagi et al. | 118/726 |
| 4,217,855 A | 8/1980 | Takagi | 118/719 |
| 4,392,931 A | 7/1983 | Maniv et al. | 204/192 R |
| 4,424,103 A | 1/1984 | Cole | 204/192 R |
| 4,622,919 A | 11/1986 | Suzuki et al. | 118/718 |

(List continued on next page.)

FOREIGN PATENT DOCUMENTS

| | | | |
|---|---|---|---|
| DE | 19513918 C1 | 11/1996 | C23C/14/22 |
| EP | 0 269 446 | 6/1988 | C23C/14/32 |

OTHER PUBLICATIONS

Arnold, S.M. et al., "Ion Beam Sputter Deposition Of Low Loss A12O3 Films For Integrated Optics" Thin Solid Films, 165 (1988) 1–9, Lausanne, Switzerland.

Bricault, R.J. et al., "Deposition of Boron Nitride Thin Films By Ion Beam Assisted Deposition", Nuclear Instruments and Methods in Physics Research B21 (1987) 586–587, North–Holland, Amsterdam.

PCT Search Report for corresponding PCT Application PCT/US01/21517, mailed Feb. 4, 2002.

PCT Search Report for PCT Application PCT/US01/21516, mailed Feb. 4, 2002.

Primary Examiner—Steven H. VerSteeg
(74) Attorney, Agent, or Firm—Kurt Rauschenbach; Rausenbach Patent Law Group, LLC

(57) ABSTRACT

A deposition system is described. The deposition system includes a deposition source that generates deposition flux comprising neutral atoms and molecules. A shield defining an aperture is positioned in the path of the deposition flux. The shield passes the deposition flux through the aperture and substantially blocks the deposition flux from propagating past the shield everywhere else. A substrate support is positioned adjacent to the shield. A dual-scanning system scans the substrate support relative to the aperture with a first and a second motion.

30 Claims, 6 Drawing Sheets

U.S. PATENT DOCUMENTS

| | | |
|---|---|---|
| 4,675,096 A | 6/1987 | Tateishi et al. .............. 204/298 |
| 4,692,233 A | 9/1987 | Casey ........................ 204/298 |
| 4,693,803 A | 9/1987 | Casey et al. ................. 204/298 |
| 4,777,908 A | 10/1988 | Temple et al. .............. 118/719 |
| 4,793,908 A | 12/1988 | Scott et al. ............ 204/192.26 |
| 4,795,656 A | 1/1989 | Mizoguchi et al. ........... 427/38 |
| 5,240,583 A | 8/1993 | Ahonen ................. 204/298.04 |
| 5,356,673 A | 10/1994 | Schmitt et al. ............. 427/446 |
| 5,536,324 A | 7/1996 | Fuchita ....................... 118/726 |
| 5,571,332 A | 11/1996 | Halpern ................ 118/723 HC |
| 5,594,231 A | 1/1997 | Pellicori et al. ............ 235/462 |
| 5,656,138 A * | 8/1997 | Scobey et al. .......... 204/192.12 |
| 5,798,027 A | 8/1998 | Lefebvre et al. ....... 204/192.26 |
| 6,338,775 B1 * | 1/2002 | Chen ..................... 204/192.11 |
| 6,495,010 B2 * | 12/2002 | Sferlazzo ............... 204/298.27 |
| 2002/0134668 A1 * | 9/2002 | Wan et al. ............. 204/192.11 |

\* cited by examiner

DUAL-SCAN THIN FILM PROCESSING SYSTEM

RELATED APPLICATIONS

This application claims priority to provisional patent application Ser. No. 60/217,049, filed on Jul. 10, 2000, the entire disclosure of which is incorporated herein by reference. This application is also related to provisional patent application Ser. No. 60/266,114, filed on Feb. 2, 2001, the entire disclosure of which is incorporated herein by reference.

FIELD OF THE INVENTION

The present invention relates generally to thin film deposition and etching systems. In particular, the present invention relates to methods and apparatus for depositing thin films with very high uniformity or etching material at a highly uniform etch rate.

BACKGROUND OF THE INVENTION

There are three common techniques used to deposit thin films onto substrates. These techniques are evaporation, magnetron sputtering, and ion beam deposition. FIG. 1 illustrates a schematic diagram of a prior art electron beam evaporation deposition system 10. The evaporation system 10 is enclosed in a vacuum chamber 12. An electron gun 14 generates an electron beam 16 that is used to heat a crucible 18 containing the deposition material to a temperature that causes the deposition material to evaporate. The electron beam is deflected with a magnet 20 that causes the electron beam to strike the desired location in the crucible 18. Typical evaporation systems have multiple crucibles.

Some evaporation systems include multiple electron guns that allow deposition material from two or more sources to be deposited simultaneously onto a substrate. Alternatively, a thermal heating element (not shown) is used to heat the crucible 18. A substrate support 22 that typically supports multiple substrates 23 is positioned in the path of the evaporated material. In order to increase the uniformity of the deposited thin film, the substrate support 22 may be rotated with a motor 24.

Magnetron sputter deposition systems use a diode device and a magnet to generate a plasma. A target is biased to a negative potential that is high enough to induce a breakdown in the surrounding gas and to sustain a plasma. The target atoms are sputtered onto the substrate to be deposited, which is placed in front of the target at a distance ranging typically between two and ten inches. The magnet is used to generate a magnetic field behind the target in order to trap the electron, thereby enhancing the bombarding efficiency of the ions.

FIG. 2 illustrates a schematic diagram of a prior art ion beam sputter deposition system 50. The ion beam sputter deposition system 50 is enclosed in a vacuum chamber 52. An ion source 54 generates an ion beam 56 that is directed to one or more targets 58. The ion beam 56 strikes the target 58 and sputters neutral atoms from the target 58 with a deposition flux 60. A substrate support 62 that typically supports multiple substrates 64 is positioned in the path of the deposition flux 60. The deposition flux 60 bombards the substrates thereby depositing a sputtered thin film. In order to increase the uniformity of the sputtered thin film, the substrate support 62 may be rotated with a motor 66. Ion beam sputtering is advantageous because it permits independent control over the energy and current density of the bombarding ions.

The thickness uniformity achieved with these prior art techniques is limited by the flux uniformity at the substrate plane and the type of substrate rotation. The flux uniformity can be adversely affected by target or deposition material imperfections that cause hot and cold spots. Typically, the flux uniformity changes with time. The flux uniformity can be improved somewhat by using a large target and by using a long distance from the target to the substrate. However, there are practical limits to the size of the target and the distance from the target to the substrate. Highly uniform thin films cannot practically be achieved with these prior art techniques.

SUMMARY OF THE INVENTION

The present invention relates to methods and apparatus for processing thin films with very high uniformity. A deposition system according to the present invention includes a beam aperture and/or a dual-scanning system that improves deposition uniformity. A method according to the present invention passes deposition flux from a deposition source though an aperture and translates substrates relative to the deposition flux with a first and a second motion. In one embodiment, the thin film uniformity is improved by scanning one motion much faster than the other motion. In another embodiment, thin film uniformity can be improved by over-scanning at least one type of motion.

Accordingly, the present invention features a deposition system. The deposition system includes a deposition source that generates deposition flux comprising neutral atoms and molecules. In one embodiment, the deposition source is an ion beam sputter deposition source that includes an ion source and a target that is positioned in the path of the ion beam. The target generates the deposition flux when exposed to the ion beam. In one embodiment, the ion beam sputter deposition source comprises a magnetron sputtering source. In one embodiment, the deposition system also includes an ion source that generates an ion beam that strikes the deposition area for ion beam assisted deposition.

A shield defining an aperture is positioned in the path of the deposition flux. The shield passes the deposition flux though the aperture and substantially blocks the deposition flux from propagating past the shield everywhere else. In one embodiment, the aperture is shaped to increase the transmitted deposition flux. In one embodiment, the aperture is shaped to reduce the over-scan area. A substrate support is positioned adjacent to the shield.

The deposition system also includes a dual-scanning system. By dual-scan we mean a scanning system that scans the substrate support relative to the aperture with a first and a second motion. The first and the second motion may be any type of motion such as translational or rotational motion. The first and the second type of motion may be the same or different types of motion. For example, in one embodiment, the dual-scanning system scans with a translational and a rotational motion. In another embodiment, the dual-scanning system scans with a first and a second translational motion.

In one embodiment, the scan rate of one motion is substantially greater than the scan rate of the other motion. For example the scan rate of one motion can be at least five times greater than the scan rate of the other type of motion. In one embodiment, the scan rate of at least one of the motions varies with time during deposition.

The dual-scanning system may be any type of scanning system that scans the substrate support relative to the aperture with two motions. In one embodiment, the dual-scanning system includes a rotational scanning system and a translational scanning system. The rotational scanning system causes a rotational motion having a rotational rate. The translational scanning system causes a translational motion having a translation rate. In one embodiment, the rotational motion is at least five times greater than the translation rate of the translational motion.

The deposition system may include a baffle that causes a pressure at the deposition source to be higher than the pressure at the substrate support. The deposition system may include a gas manifold that is positioned so as to cause a pressure at the deposition source to be higher than the pressure at the substrate support. The deposition system may also include an in-situ monitoring system that monitors properties of the thin film during deposition.

The present invention also features a method of depositing a uniform thin film. The method includes generating deposition flux. In one embodiment, the deposition flux is generated by ion beam sputtering. In another embodiment, the deposition flux is generated by evaporation. A substrate is scanned relative to the deposition flux with a first motion and a second motion, thereby depositing a uniform thin film onto the substrate.

The scan rate of the first motion is substantially greater than the scan rate of the second motion. In one embodiment, the first motion is a rotational motion having a rate of rotational and the second motion is a translational motion having a translational scan rate. For example, the rotational rate of the rotational motion may be five times greater than the translational scan rate in the translational dimension.

In one embodiment, the method includes passing the deposition flux through an aperture, thereby increasing the deposition flux. The method may include overscanning the substrate relative to the deposition flux with at least one of the first motion and the second motion. The method may also include monitoring deposition parameters of the thin film in-situ.

The present invention also features an ion beam sputter deposition system that includes an ion source that generates an ion beam. A target is positioned in the path of the ion beam. In one embodiment, the target is a compound target having at least two different target materials. In one embodiment, the target is rotatable with at least two target faces. When the ion beam strikes the target, neutral atoms and/or molecules are sputtered from the target with a deposition flux.

A shield defining an aperture is positioned in the path of the deposition flux. The shield passes the deposition flux though the aperture and substantially blocks the deposition flux from propagating past the shield everywhere else. In one embodiment, the aperture is shaped to increase the transmitted deposition flux. In one embodiment, the aperture is shaped to reduce the over-scan area. A substrate support is positioned adjacent to the shield.

The ion beam sputter deposition system also includes a rotational and a translational scanning system that scans the substrate support relative to the aperture. The rotational scanning system produces a rotational motion having a rotational rate. The translational scanning system produces a translational motion having a translation rate. In one embodiment, the rotation rate is substantially greater than the translational rate. For example, the rotation rate may be at least five times greater than the translation rate. The rotation rate and/or the translation rate may vary with time during deposition.

The ion beam sputter deposition system may include differential pumping. The ion beam sputter deposition system may include a vacuum pump having an inlet that is positioned relative to the target and the substrate support so that a pressure at the substrate support is lower than a pressure at the target. The deposition system may include a baffle that causes the pressure at the substrate support to be lower than the pressure at the target.

BRIEF DESCRIPTION OF THE DRAWINGS

This invention is described with particularity in the appended claims. The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 1:
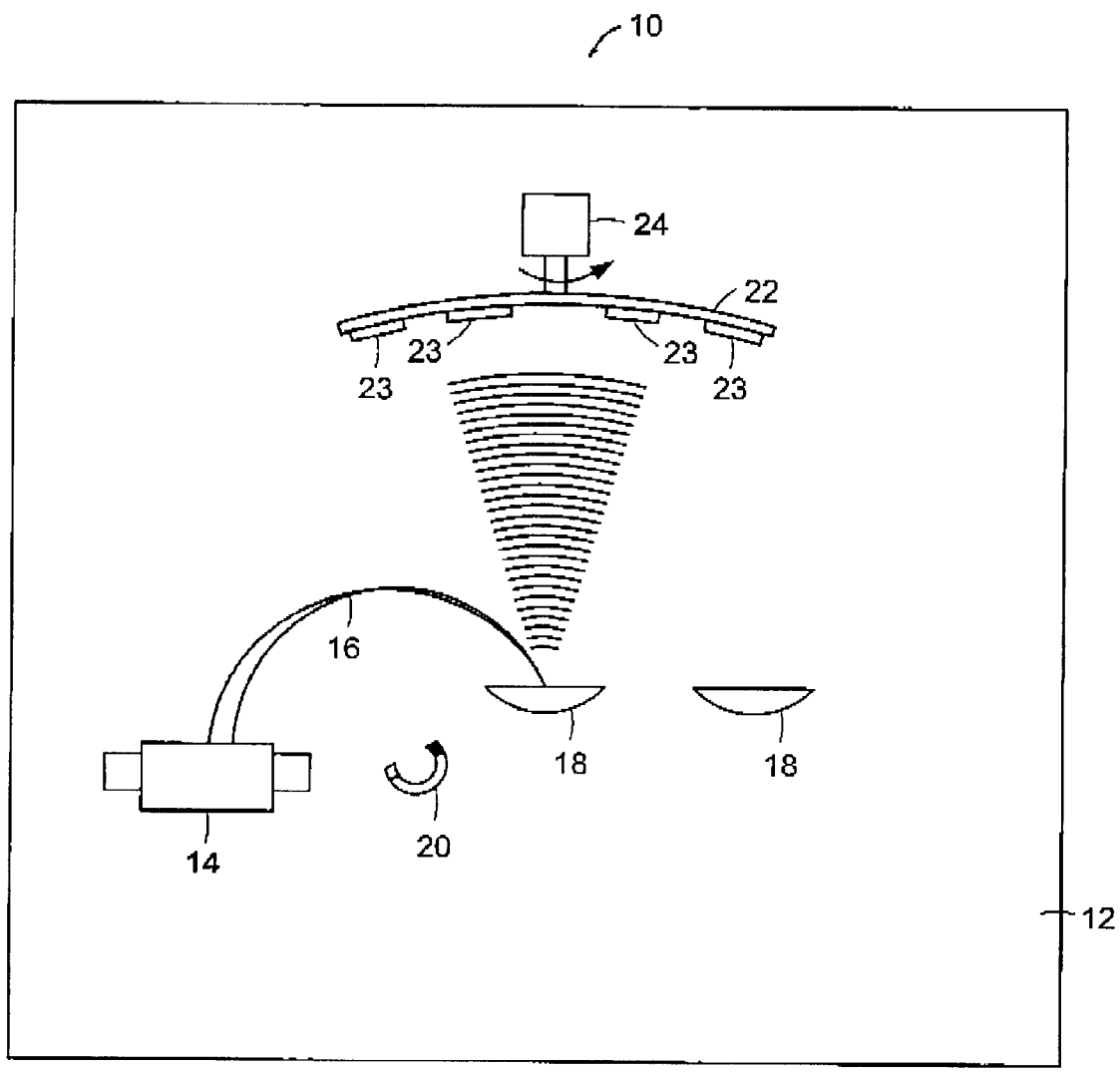
FIG. 1 illustrates a schematic diagram of a prior art electron beam evaporation deposition system.
Figure 2:
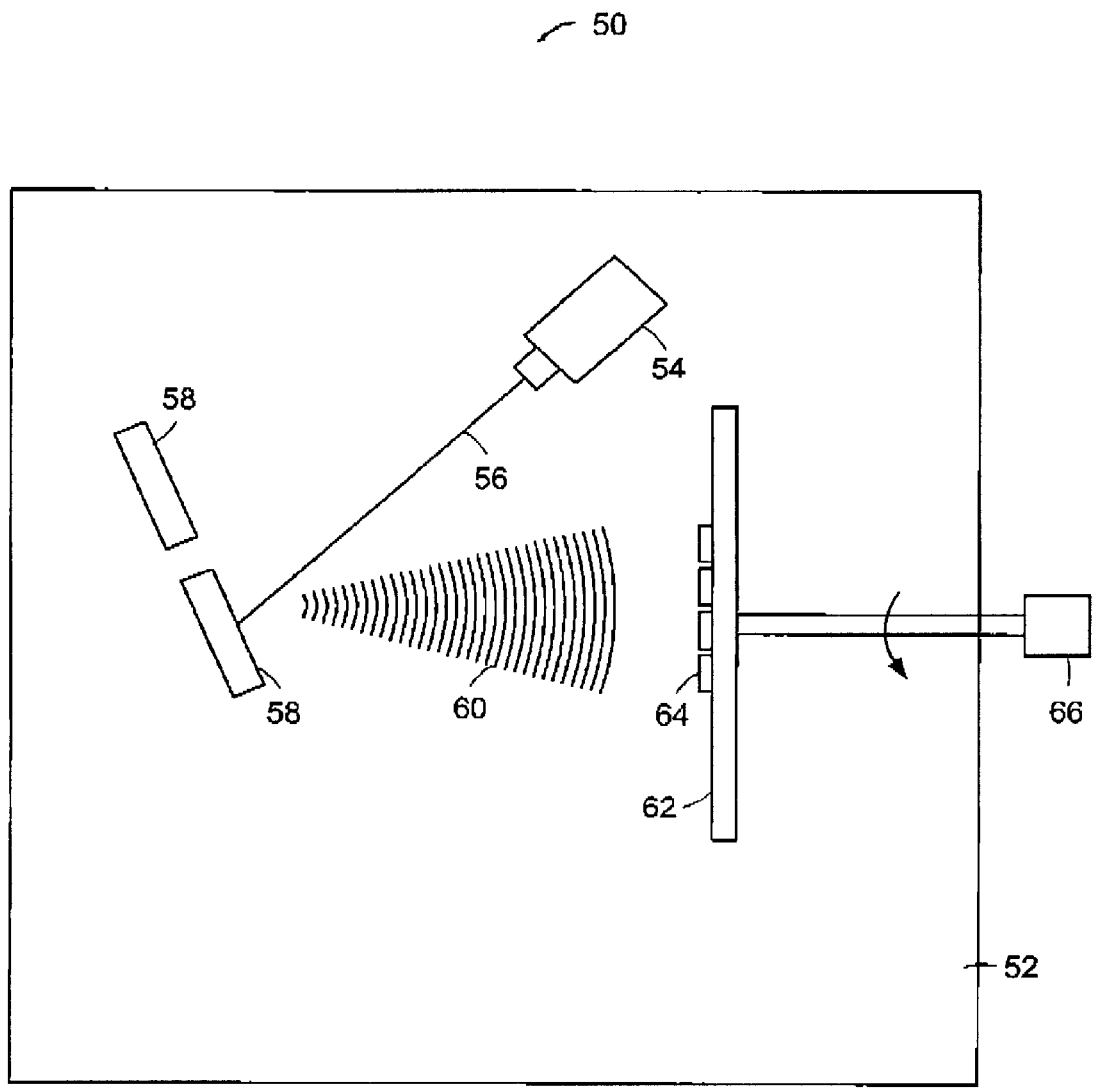
FIG. 2 illustrates a schematic diagram of a prior art ion beam sputter deposition system.

There are many devices that require highly uniform optical thin film coatings. For example, optical filters used in applications such as optical fiber communication systems, may require multiple layers of highly uniform thin films, where each layer has a precise thickness. Optical fiber communication systems are now widely deployed. Recently, new communications services such as the Internet, high-speed data links, video services, and wireless services have resulted in a dramatic increase in the need for bandwidth. Data traffic is currently increasing at a rate of 80% per year and voice traffic is currently increasing at a rate of 10% per year.

One way of increasing bandwidth in optical fiber communications system is to increase the number of wavelengths of light propagating in the optical fiber. Wavelength division multiplexing (WDM) is an optical technology that propagates many wavelengths in the same optical fiber, thus effectively increasing the aggregate bandwidth per fiber to the sum of the bit rates of each wavelength. Bandwidths greater than 1 terabits/sec have been demonstrated in WDM based communication systems.

Dense Wavelength Division Multiplexing (DWDM) is a technology that implements WDM technology with a large number of wavelengths. DWDM is typically used to describe WDM technology that propagates more than 40 wavelengths in a single optical fiber. As the number of wavelengths increases, the channel width and channel spacing decreases. To achieve the required channel width and channel spacing in DWDM communication systems, high quality, high performance optical filters are required. These optical filters must exhibit low loss and narrow band transmission characteristics over the wavelength spectrum of 1.3 µm to 1.55 µm. The filters must also have good mechanical properties and must be stable in a variety of operating environments.

For example, DWDM communication systems require many band-pass filters that can separate a single wavelength (channel) from the other wavelengths (channels) propagating in the system. One type of optical filter that is used as a band-pass filter in DWDM communication systems is a Fabry Perot interference filter. Fabry Perot filters comprise two high-reflectance multilayers films separated by a λ/2 layer. In operation, multiple interferences in the λ/2 space layer cause the filter output spectral characteristic to peak sharply over a narrow band of wavelengths that are multiples of the λ/2 space layer.

Another type of optical filter used in DWDM communication systems is a dielectric thin film interference filter. These filters comprise alternate layers of high refractive index and low refractive index material. Each layer is a λ/4 thick. In operation, light reflected from the high index layers does not experience a phase shift, but light reflected from the low index layers does experiences a 180 degree phase shift. Successive reflections recombine constructively at the front face producing a highly reflected beam having a narrow wavelengths range. Light having wavelengths outside of this narrow range is reflected at only very low intensity levels.

A dielectric thin film interference filter can be fabricated by depositing alternating layers of high and low refractive index material onto a glass substrate. For example, alternating layers of $SiO_2$ and $Ta_2O_5$ can be used. The refractive index and the uniformity across the filter must be controlled to a very high precision in order to achieve the desired filter characteristics.

Figure 3:
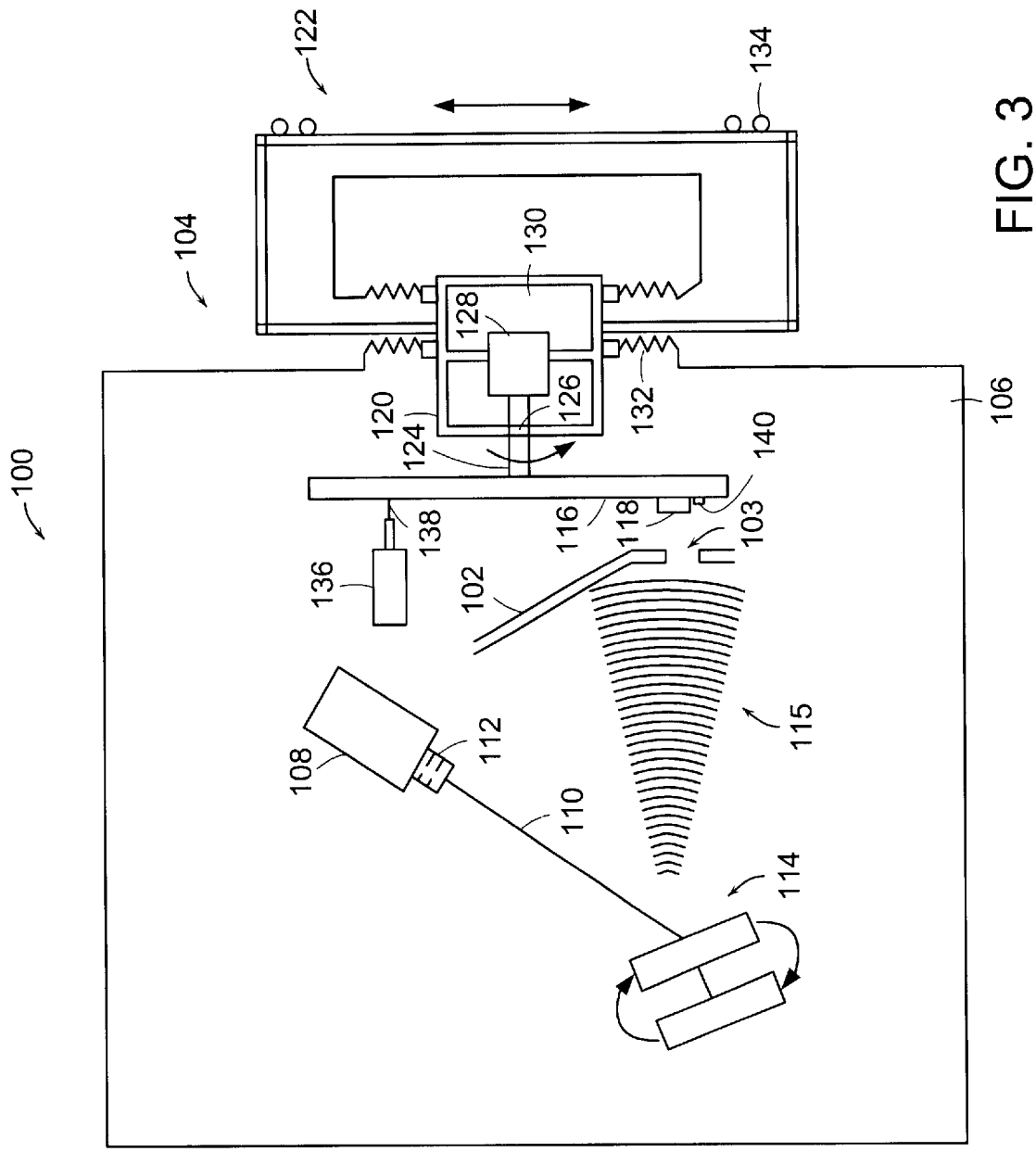
FIG. 3 illustrates a schematic diagram of an ion beam sputter deposition system that includes a beam aperture and a mechanical dual-scanning system according to the present invention.

One embodiment of the present invention achieves precision thin film uniformity by aperturing deposition flux and then transporting the substrates in a path of the apertured deposition flux with a first and a second motion. FIG. 3 illustrates a schematic diagram of an ion beam sputter deposition system 100 that includes an ion shield 102 that defines a beam aperture 103 and a mechanical dual-scanning system 104 according to the present invention. The system 100 also includes a vacuum chamber 106. In one embodiment, the vacuum chamber 106 can achieve high vacuum in the range of less than $10^{-7}$ torr.

The system 100 also includes an ion source 108 that generates an ion beam 110. In one embodiment, the system 100 includes two or more ion sources that each generate an ion beam. A gas, such as argon or oxygen, or a mixture of gases, is introduced into the ion source 108. A plasma is generated in the ion source 108. Ions are extracted from the plasma from two or more multi-aperture electrodes 112. The ions are then accelerated. In one embodiment, the ions are accelerated to energies in the range of 500 eV to 2000 eV.

One or more targets 114 are positioned in the path of the accelerated ion beam 110. The targets 114 may include metal or dielectric materials. The targets 114 may be formed of a single target material or may be formed of a compound target material comprising two or more materials. In some applications, dielectric thin films are formed by using metallic targets and by injecting a second gas such as oxygen or nitrogen in the ion source 108. In other application, dielectric thin films are formed by directly injecting the second gas in the vacuum chamber 106.

Any target configuration can be used in the deposition system 100 of the present invention and there are numerous target configurations known in the art and commercially available. In one embodiment, the system 100 includes a rotatable target with at least two target faces, as shown in FIG. 3. The ion beam 110 strikes the target and sputters neutral atoms from the target 114 with a deposition flux 115.

The shield 102 that defines the aperture 103 is positioned in the path of the deposition flux 115. The shield 102 passes deposition flux 115 through the aperture 103 and substantially blocks the deposition flux 115 from propagating past the shield 102 everywhere else. The aperture 103 spatially defines the deposition flux 115 that reaches the substrates.

A substrate support 116 is positioned proximate to the aperture 103 in the path of the deposition flux 115. In one embodiment, the substrate support 116 is a disk as shown in FIG. 3. The substrate support 116 typically holds multiple substrates 118, but may hold only one substrate in some systems and for some applications. The substrate support 116 is attached to the mechanical dual-scanning system 104 that scans with two motions at two scan rates. In one embodiment, the scan rates of the two scanning motions are different and independently controllable. The scan rate may be a rotation rate or a translation rate depending upon the type of scanning motion.

In one embodiment, the mechanical dual-scanning system 104 includes a rotational 120 and a translational scanning system 122. The rotational scanning system 120 includes a shaft 124 that is rotationally attached to the substrate support 116 and positioned through a vacuum feed through 126. The shaft 124 is rotated by a motor 128 at rotation rate. In one embodiment, the motor 128 rotates the shaft 124 at rotation rate that is greater than 1000 RPMs. In one embodiment, the motor 128 is positioned inside an enclosure 130 that is attached to the vacuum chamber 106 with a vacuum bellows 132. This allows the motor 128 to translate along a surface of the vacuum chamber 106. The inside of the enclosure 130 maybe maintained at atmospheric pressure.

The translational scanning system 122 includes a linear drive mechanism 134 that translates the substrate support 116 in a linear direction at a translation rate. The linear drive mechanism 134 may be attached to the substrate support 116 and may also be attached to the vacuum chamber 106. As the linear drive mechanism 134 moves, the substrate support 116 translates along with the drive mechanism 134, thereby causing the substrate support to translate relative to the aperture 103 at the translation rate.

In one embodiment, the scan rate of one scanning motion is much faster than the scan rate of the other scanning motion. Using one scan rate that is much faster compared to the other scan rate reduces ripples in the thickness uniformity. By much faster, we mean that one scan rate is greater than approximately five-time faster than the other scan rate. For example, the rotation rate may be much faster than the linear translation rate.

In one embodiment, the scan rate of at least one motion is varied during the deposition. Varying the scan rate can improve uniformity. For example, in systems where the mechanical dual-scanning system 104 includes a rotational scanning system 120, there is typically a radial uniformity effect. This is because the deposition flux 115 is a function of the radial position from the center of the aperture 103. The radial uniformity effect can be at least partially compensated by varying the linear translation rate. For example, in one embodiment, a constant 1/R correction is applied to the linear translation rate in order to improve radial uniformity.

There are numerous other embodiments of the mechanical dual-scanning system 104 of the present invention. Any combination of scanning the substrate support 116, the aperture 103, and/or the target 114 with at least two scanning motions will improve the uniformity as described herein. For example, in one embodiment, the substrate support 116 is stationary and the aperture 103 and/or target 114 are scanned with two scanning motions. In another embodiment, the substrate support 116 is scanned with one scanning motion and the aperture 103 and/or target 114 are scanned with another scanning motion.

In one embodiment, the ion beam sputter deposition system 100 includes a second ion source 136 that generates a second ion beam 138 that is used for ion beam assisted deposition. The second ion beam 138 can be used to improve adhesion of the thin film to the substrate 118. The second ion beam 138 can also be used to change the properties of the thin film during deposition.

The second ion source 136 is positioned so that the second ion beam 138 strikes the substrate in a region that is exposed to the deposition flux 115. In the embodiment shown in FIG. 3, the substrate support 116 comprises a rotating disk. One end of the rotating disk is positioned adjacent to the aperture 103 that passes the deposition flux 115. The other end of the rotating disk is positioned in the path of the second ion beam 138. The radial distance to the aperture 103 is approximately the same as the radial distance to the path of the second ion beam 138.

In one embodiment, the ion beam sputter deposition system 100 includes an ion detector 140 that monitors the deposition flux 115. The ion detector 140 may be a quartz oscillator that measures thin film thickness and/or deposition rate. In one embodiment, the shield 102 includes a second aperture (not shown) that passes a portion of the deposition flux 115. The ion detector 140 is positioned behind the second aperture to detect and measure the deposition flux 115.

The measurement of the deposition flux 115 can be used to change the parameters of the ion source 108 for various applications including generating a more uniform ion beam. In addition, the measurement of the deposition flux 115 can be used to control the rotation rate of the rotational scanning system 120 and/or the translation rate of the translational scanning system 122.

The present invention also features a magnetron sputtering deposition system that includes a beam aperture and/or a dual-scanning system that improves deposition uniformity. The magnetron sputtering system is similar to the ion beam sputter deposition system 100 of FIG. 3. However, a magnetron sputtering source generates the deposition flux 115.

In addition, the present invention features an evaporation system that includes a beam aperture and/or a dual-scanning system that improves deposition uniformity. The evaporation system is similar to the ion beam sputter deposition system 100 of FIG. 3. However, an evaporation source, such as an electron beam evaporation source, generates the deposition flux 115.

In one embodiment, the ion beam sputter deposition system 100 includes differential pumping. The system is configured so that the region that surrounds the target 114 and ion source 108 that generates the deposition flux 115 is pumped to one pressure and the region surrounding the substrates 118 is pumped to another different pressure. In one embodiment, the region surrounding the substrates 118 is pumped to a lower pressure than the region surrounding the target 114 and ion source 108. The differentially pumped ion beam sputtering system of the present invention has numerous advantages over prior art systems. For example, the sputtered films deposited by such systems usually have higher purity because they are deposited at lower pressure.

Figure 4:
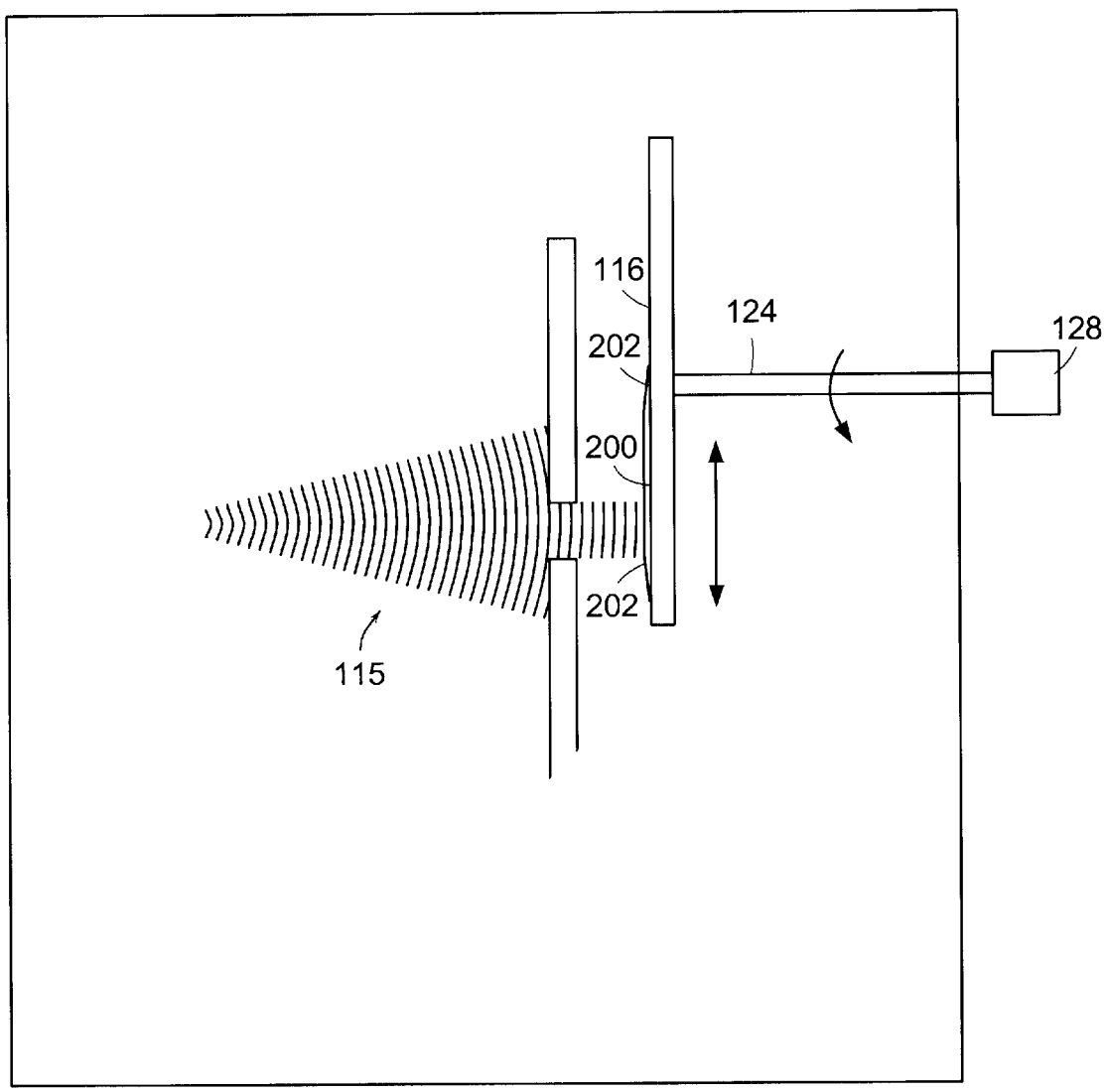
FIG. 4 illustrates a method of over-scanning the substrate during deposition using the ion beam sputter deposition system of FIG. 3.

FIG. 4 illustrates a method of over-scanning the substrate using the ion beam sputter deposition system 100 of FIG. 3. The over-scanning method of the present invention improves uniformity of the deposited thin film by extending the scanning dimension to eliminate edge effects. In one embodiment, the desired deposition area 200, where a uniform thin film is desired, is in the shape of a circle or a ring. The over-scan area 202 corresponds to the edge of the circle. The over-scan area 202 is the area that corresponds to where the linear drive mechanism 134 (FIG. 3) changes direction.

The method of over-scanning includes translating the linear drive mechanism 134 in the linear direction significantly past the desired deposition area 200 so that the desired deposition area 200 is exposed to an equal amount of deposition flux 115. In one embodiment, a plurality of substrates is positioned in the desired deposition area 200. In another embodiment, one large substrate is positioned on the substrate support 116 and the desired deposition area is cleaved or cut from the substrate after the deposition.

Figure 5:
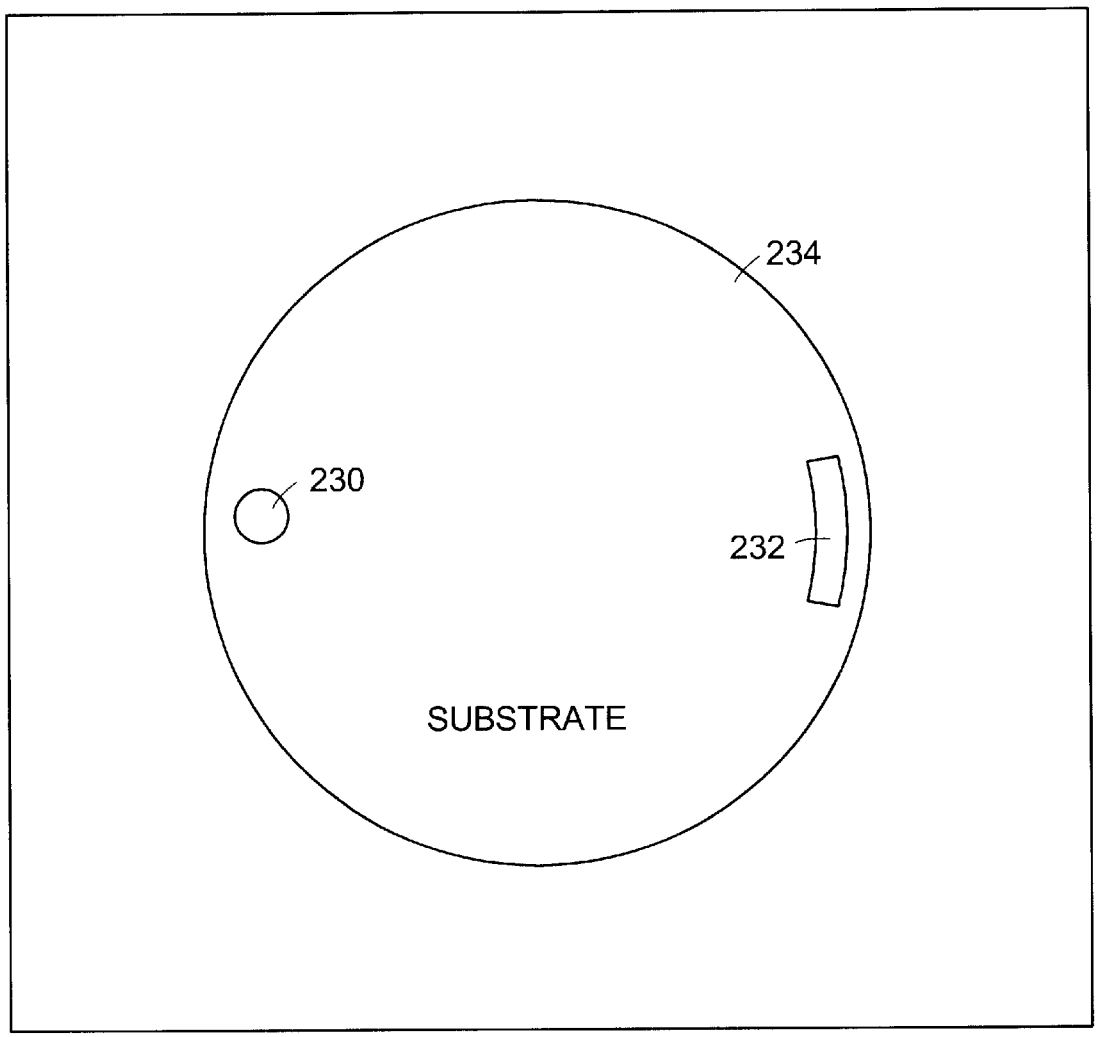
FIG. 5 illustrates a round and a shaped aperture of the present invention that increase the deposition flux in the ion beam sputter deposition system of FIG. 3.

FIG. 5 illustrates a round 230 and a shaped aperture 232 of the present invention that increase the deposition flux in the ion beam sputter deposition system 100 of FIG. 3. The round 230 and the shaped aperture 232 are superimposed onto a substrate 234. There are numerous shapes for the aperture 103 (FIG. 3) of the present invention that will increase the deposition flux. For example, the aperture 103 may be round, elliptical, rectangular, ring shaped, or other shape that is chosen to increase the deposition flux.

In one embodiment, the shape of the aperture is chosen to simultaneously increase the transmitted deposition flux 115 and to reduce the over-scan area 202. For example, one shape that simultaneously increases the transmitted deposition flux 115 and reduces the over-scan area 202 is a shape that has a radial dimension that is significantly less than the dimension tangent to a circle enclosing the desired deposition area. In one embodiment, the shield includes two apertures and one of the two apertures is used to monitor the deposition flux or to pass a second ion beam that is used for ion beam assisted deposition.

Figure 6:
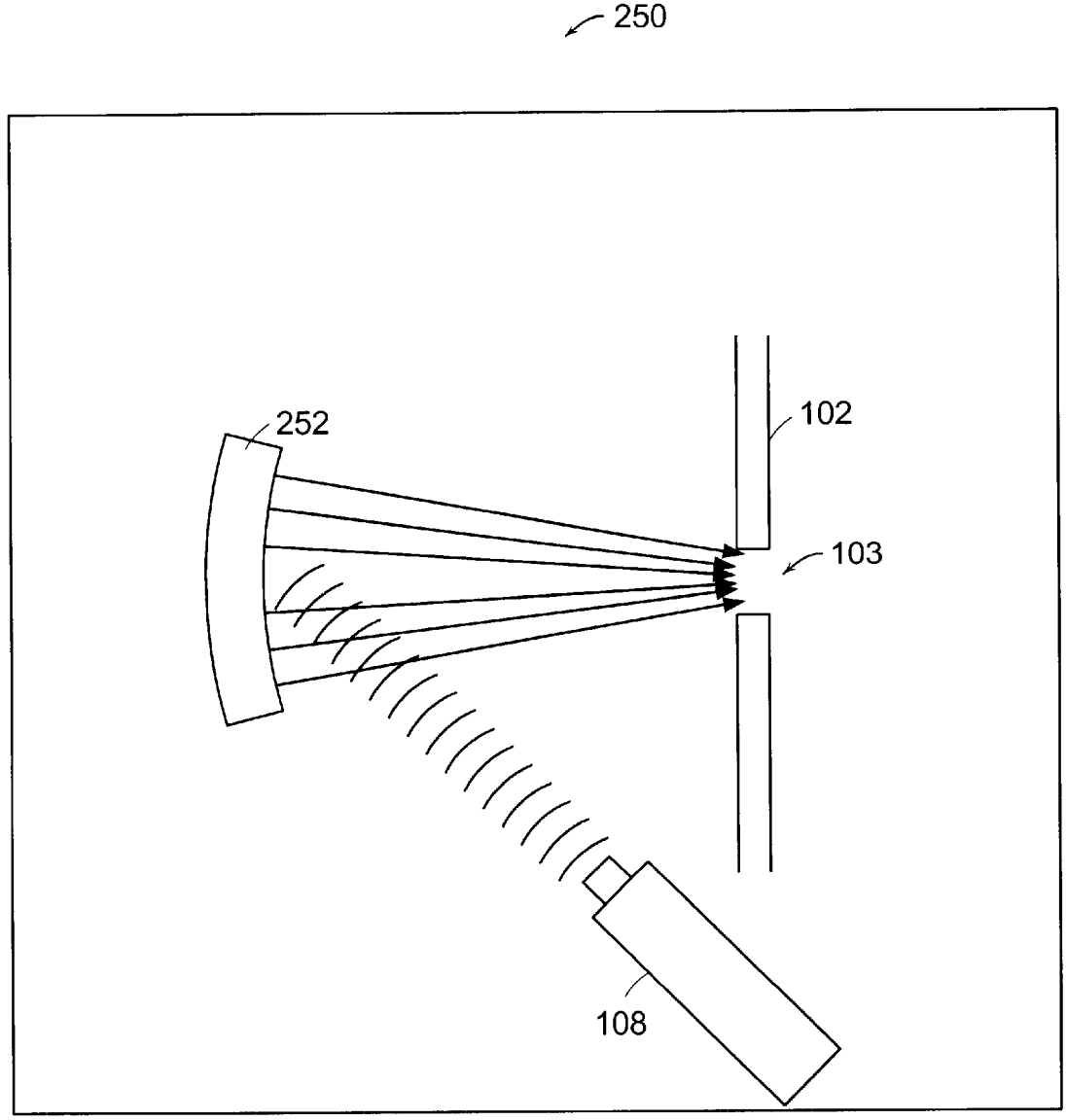
FIG. 6 illustrates a schematic diagram of an ion beam sputter deposition system of the present invention that uses a shaped target to provide enhanced beam intensity.

FIG. 6 illustrates a schematic diagram of an ion beam sputter deposition system 250 of the present invention that uses a shaped target 252 to provide enhanced beam intensity. The target emits neutrals that expand with a cosine theta distribution. Consequently, the deposition flux that transmits though the aperture 103 is typically a small fraction of the deposition flux 115 that emits from the target. In one embodiment, the ion beam sputter deposition system 100 uses a shaped target 252 that focuses the neutral beam in order to increase the deposition flux though the aperture 103. The shaped target 252 can be any shape that increases the deposition flux though the aperture 103. In one embodiment, the shaped of the target is concave, parabolic or hemispherical.

In one embodiment, the ion beam sputter deposition system of the present invention includes an in-situ thin film monitor. In-situ monitoring is a technique for monitoring the thickness and/or other properties of the thin film while the thin film is being deposited. Information from in-situ monitoring can inform the user, or a processor that controls the system, of various physical parameters of thin film being deposited and of performance metrics of the deposition system. For example, in-situ monitoring can inform the user or a processor that the layer is deposited to the desired thickness and has the desired physical properties, so the deposition process may be terminated.

In one embodiment, the in-situ thin film monitor includes a light source, such as a tunable laser that may generate a single wavelength light beam. The wavelength of the laser is chosen so that the deposition material absorbs a portion of the laser light. The laser is directed at the desired deposition area and propagates though the deposition area and the substrate. In one embodiment, the laser is positioned so that the light beam propagates along with the ion beam.

A detector is positioned proximate to the back-side of the substrate and monitors the intensity of light transmitted though the deposition area and the substrate. As the film thickness increases, a larger fraction of the light beam is absorbed in the thin film and the transmitted and thus detected light beam has a lower intensity. The thickness and the deposition rate can be determined from a measurement of the detected light beam intensity. This information can be used to control the deposition process.

EQUIVALENTS

While the invention has been particularly shown and described with reference to specific preferred embodiments, it should be understood by those skilled in the art that various changes in form and detail may be made therein without departing from the spirit and scope of the invention as defined by the appended claims. For example, the methods and apparatus for processing thin films with very high uniformity apply to numerous types of deposition and etching systems and are not limited to ion beam and magnetron sputtering systems. Also, the ion beam sputter deposition system of the present invention may include any aperture that increases the deposition flux. In addition, there are numerous embodiments of the dual-scanning system that scan at least one of the substrate support, the aperture, and the ion beam or target.

What is claimed is:

1. A deposition system comprising:
   a. a deposition source that generates deposition flux comprising neutral atoms and molecules;
   b. a shield defining an aperture that is positioned in the path of the deposition flux, the shield passing the deposition flux though the aperture and substantially blocking the deposition flux from propagating past the shield everywhere else;
   c. a substrate support that is positioned adjacent to the shield; and
   d. a dual-scanning system that scans the substrate support relative to the aperture with a first and a second motion, at least one of the first and the second motions comprising a translational motion.

2. The deposition system of claim 1 wherein the dual-scanning system comprises a mechanical scanning system.

3. The deposition system of claim 1 wherein a scan rate of the first motion is substantially greater than a scan rate of the second motion.

4. The deposition system of claim 1 wherein a scan rate of at least one of the first motion and the second motion varies with time during deposition.

5. The deposition system of claim 1 wherein the dual-scanning system comprises a rotational scanning system and a translational scanning system, wherein the first motion comprising a rotational motion having a rotation rate and the second motion comprising a translational motion having a translation rate.

6. The deposition system of claim 5 wherein the rotation rate of the rotational motion is at least five times greater than the translation rate of the translational motion.

7. The deposition system of claim 1 wherein the aperture is shaped to increase the transmitted deposition flux.

8. The deposition system of claim 1 wherein the aperture is shaped to reduce the over-scan area.

9. The deposition system of claim 1 further comprising a baffle that causes a pressure at the substrate support to be lower than a pressure at the deposition source.

10. The deposition system of claim 1 further comprising a gas manifold that is positioned so as to causes a pressure at the deposition source to be higher than a pressure at the substrate support.

11. The deposition system of claim 1 wherein the deposition source comprises an ion beam sputter deposition source, the ion beam sputter deposition source comprising an ion beam source that generates an ion beam and a target that is positioned in the path of the ion beam, the target generating the deposition flux when exposed to the ion beam.

12. The deposition system of claim 11 wherein the ion beam sputter deposition source comprises a magnetron sputtering source.

13. The deposition system of claim 1 wherein the deposition source is an evaporation source.

14. The deposition system of claim 1 further comprising an in-situ monitoring system that monitors properties of the thin film during deposition.

15. The deposition system of claim 1 further comprising an ion source that generates an ion beam for ion beam assisted deposition, the ion source being positioned so that the ion beam strikes the deposition area.

16. A method of depositing a uniform thin film, the method comprising:
   a. generating deposition flux; and
   b. scanning a substrate relative to the deposition flux with a first motion and a second motion, wherein a scan rate of the first motion is greater than a scan rate of the second motion, thereby depositing a uniform thin film onto the substrate.

17. The method of claim 16 wherein the first motion is a rotational motion having a rotational scan rate and the second motion is a translational motion having a translational scan rate.

18. The method of claim 17 wherein the rotational rate of the rotational motion is at least five times greater than the translational scan rate.

19. The method of claim 16 further comprising passing the deposition flux though an aperture.

20. The method of claim 16 wherein the deposition flux is generated by ion beam sputtering.

21. The method of claim 16 further comprising passing the deposition flux through an aperture, thereby increasing the deposition flux.

22. The method of claim 16 further comprising overscanning the substrate relative to the deposition flux in at least one of the first motion and the second motion.

23. The method of claim 16 further comprising monitoring deposition parameters of the thin film in-situ.

24. An ion beam sputter deposition system comprising:
   a. an ion source that generates an ion beam;
   b. a target that is positioned in the path of the ion beam, the target generating deposition flux when exposed to the ion beam;
   c. a shield defining an aperture that is positioned in the path of the deposition flux, the shield passing the deposition flux though the aperture and substantially blocking the deposition flux from propagating past the shield everywhere else;

d. a substrate support that is positioned adjacent to the shield; and e. a dual-scanning system that scans the substrate support, the dual-scanning system comprising a rotational scanning system that scans the substrate support at a rotation rate and a translational scanning system that scans the substrate support relative to the aperture at a translational rate.

25. The ion beam sputter deposition system of claim 24 wherein the rotation rate is substantially greater than the translational rate.

26. The ion beam sputter deposition system of claim 24 wherein a scan rate of at least one of the rotational scanning system and the translational scanning system varies with time during deposition.

27. The ion beam sputter deposition system of claim 24 further comprising a vacuum pump having inlet positioned relative to the target and the substrate support so that a pressure at the substrate support is lower than a pressure at the target.

28. The ion beam sputter deposition system of claim 24 wherein the ion beam sputter deposition system comprises a magnetron sputtering system.

29. The ion beam sputter deposition system of claim 24 wherein the target comprises at least two target faces, the target being rotatable between the at least two target faces.

30. The ion beam sputter deposition system of claim 24 wherein the target comprises a compound sputtering target including at least two different target materials.

* * * * *